(12) United States Patent
Zheng

(10) Patent No.: US 10,440,799 B2
(45) Date of Patent: Oct. 8, 2019

(54) OPTICAL MODULE

(71) Applicants:Hisense Broadband Multimedia Technologies Co., Ltd., Qingdao, Shandong (CN); Hisense Broadband Multimedia Technologies, Ltd., Tortola (VG)

(72) Inventor: Long Zheng, Shandong (CN)

(73) Assignees: Hisense Broadband Multimedia Technologies Co., Ltd., Qingdao, Shandong (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 15/857,987

(22) Filed: Dec. 29, 2017

(65) Prior Publication Data

US 2018/0292620 A1 Oct. 11, 2018

(30) Foreign Application Priority Data

Apr. 6, 2017 (CN) .......................... 2017 1 0220900
May 17, 2017 (CN) .......................... 2017 1 0365787
May 23, 2017 (CN) .......................... 2017 1 0370658
Jul. 19, 2017 (CN) .......................... 2017 1 0592117
Aug. 17, 2017 (CN) .......................... 2017 1 0706221

(Continued)

(51) Int. Cl.
*H04B 10/00* (2013.01)
*H05B 37/02* (2006.01)
(Continued)

(52) U.S. Cl.
CPC ........... *H05B 37/0209* (2013.01); *F21V 5/04* (2013.01); *F21V 23/005* (2013.01);
(Continued)

(58) Field of Classification Search
USPC .................................... 398/139, 138; 385/92
See application file for complete search history.

(56) References Cited

U.S. PATENT DOCUMENTS 5,639,989 A * 6/1997 Higgins, III .......... H01L 23/552
174/386
7,917,037 B2 * 3/2011 Liu ...................... G02B 6/4277
398/135

(Continued)

*Primary Examiner* — David C Payne
*Assistant Examiner* — Pranesh K Barua
(74) *Attorney, Agent, or Firm* — Brinks Gilson & Lione

(57) ABSTRACT

The present disclosure discloses an optical module, and relates to the field of optical fiber communication technologies. A first sealing piece is configured to block the gap between the optical fiber ribbon and the blocking piece. For the optical module and an optical communication terminal provided in the present application, an electromagnetic wave generated by the optical module is directly radiated or is reflected several times until the electromagnetic wave enters a wave-absorbing pad. The wave-absorbing pad absorbs to the greatest extent an electromagnetic wave generated by a chip, and can reduce to the greatest extent electromagnetic interference (EMI) generated by the optical module. By means of the present disclosure, the sealing performance of a housing of the optical module can be improved, so that an EMI shielding effect is improved, thereby effectively reducing EMI.

18 Claims, 14 Drawing Sheets

(30) Foreign Application Priority Data

Aug. 22, 2017 (CN) .......................... 2017 1 0725586
Sep. 18, 2017 (CN) .......................... 2017 1 0842912
Oct. 10, 2017 (CN) .......................... 2017 1 0934006

(51) Int. Cl.

| | | |
|---|---|---|
| *F21V 29/504* | (2015.01) | |
| *F21V 29/508* | (2015.01) | |
| *F21V 29/83* | (2015.01) | |
| *F21V 5/04* | (2006.01) | |
| *F21V 23/00* | (2015.01) | |
| *G02B 6/42* | (2006.01) | |
| *H04B 10/40* | (2013.01) | |
| *H04B 10/50* | (2013.01) | |
| *H04B 10/85* | (2013.01) | |
| *H04B 15/02* | (2006.01) | |
| *H05K 9/00* | (2006.01) | |

(52) U.S. Cl.
CPC .......... *F21V 29/504* (2015.01); *F21V 29/508* (2015.01); *F21V 29/83* (2015.01); *G02B 6/4206* (2013.01); *G02B 6/428* (2013.01); *G02B 6/4214* (2013.01); *G02B 6/4246* (2013.01); *G02B 6/4251* (2013.01); *G02B 6/4256* (2013.01); *G02B 6/4274* (2013.01); *G02B 6/4283* (2013.01); *G02B 6/4292* (2013.01); *H04B 10/40* (2013.01); *H04B 10/503* (2013.01); *H04B 10/85* (2013.01); *H04B 15/02* (2013.01); *H05K 9/0058* (2013.01)

(56) References Cited

U.S. PATENT DOCUMENTS

| | | | | |
|---|---|---|---|---|
| 2002/0172476 A1* | 11/2002 | Nagase | ................ | G02B 6/4204 385/92 |
| 2003/0039456 A1* | 2/2003 | Tajima | ................ | G02B 6/4204 385/92 |
| 2003/0117786 A1* | 6/2003 | Chang | ................ | H05K 9/0041 361/818 |
| 2004/0001299 A1* | 1/2004 | van Haaster | ......... | G02B 6/4277 361/118 |
| 2007/0210082 A1* | 9/2007 | English | ................ | H05K 9/0032 220/4.21 |
| 2008/0055878 A1* | 3/2008 | Salzman | ................ | H05K 3/284 361/818 |
| 2009/0091888 A1* | 4/2009 | Lin | ....................... | H01L 23/367 361/704 |
| 2009/0206455 A1* | 8/2009 | Harper | ................ | H01L 23/3128 257/659 |
| 2009/0211802 A1* | 8/2009 | Poulsen | ............... | H05K 9/0026 174/384 |
| 2011/0032692 A1* | 2/2011 | Niederkorn | .......... | H04B 1/3833 361/818 |
| 2012/0155054 A1* | 6/2012 | McColloch | .......... | H05K 9/0028 361/818 |
| 2012/0301152 A1* | 11/2012 | Edwards | ............... | G02B 6/4201 398/135 |
| 2013/0083229 A1* | 4/2013 | Lin | ................... | H01L 27/14623 348/336 |
| 2013/0148977 A1* | 6/2013 | Shah | ..................... | H04B 10/40 398/135 |
| 2013/0237092 A1* | 9/2013 | Rubens | .............. | H01R 13/6596 439/607.23 |
| 2013/0286609 A1* | 10/2013 | Merz | .................... | H05K 1/0216 361/760 |
| 2015/0043162 A1* | 2/2015 | Chen | ................ | H01L 23/3675 361/679.55 |
| 2016/0095266 A1* | 3/2016 | Liu | ..................... | H05K 9/0032 174/384 |
| 2016/0113161 A1* | 4/2016 | Ball | .................... | H05K 9/0032 174/381 |
| 2016/0266340 A1* | 9/2016 | Zhang | ...................... | G02B 6/32 |
| 2017/0003464 A1* | 1/2017 | Akieda | ................ | G02B 6/4245 |
| 2017/0082810 A1* | 3/2017 | Daikuhara | ........... | G02B 6/4224 |
| 2017/0134099 A1* | 5/2017 | Hara | ..................... | H04B 10/66 |
| 2017/0367175 A1* | 12/2017 | Lai | ....................... | H05K 1/0203 |
| 2018/0031789 A1* | 2/2018 | Kurashima | .......... | G02B 6/4277 |
| 2018/0138148 A1* | 5/2018 | Chen | ................. | H01L 25/0655 |

\* cited by examiner

OPTICAL MODULE

CROSS REFERENCES

The present application claims priority to Chinese Patent Application No. 201710934006.X filed on Oct. 10, 2017, Chinese Patent Application No. 201710842912.7 filed on Sep. 18, 2017, Chinese Patent Application No. 201710725586.1 filed on Aug. 22, 2017, Chinese Patent Application No. 201710706221.4 filed on Aug. 17, 2017, Chinese Patent Application No. 201710592117.7 filed on Jul. 19, 2017, Chinese Patent Application No. 201710370658.5 filed on May 23, 2017, Chinese Patent Application No. 201710365787.5 filed on May 17, 2017, and Chinese Patent Application No. 201710220900.0 filed on Apr. 6, 2017, which are herein incorporated by reference in their entireties.

The present application is relevant to the following four (4) U.S. patent applications, filed concurrently with the present application, the entireties of which are hereby incorporated by reference: U.S. patent application Ser. No. 15/857,855, entitled "Optical Module," filed on Dec. 29, 2017; U.S. patent application Ser. No. 15/857,884, entitled "Optical Module," filed on Dec. 29, 2017; U.S. patent application Ser. No. 15/857,942, entitled "Optical Module," filed on Dec. 29, 2017; and U.S. patent application Ser. No. 15/857,958, entitled "Optical Module," filed on Dec. 29, 2017.

BACKGROUND

Technical Field

The present disclosure relates to the field of optical fiber communication technologies, and in particular, to an optical module.

Related Art

In the optical fiber communication technology, optical signals are used as carriers for information to perform high-speed, long-time, and reliable information transmission. The effect of an optical module is optical-to-electrical conversion. That is, a transmit end converts an electrical signal into an optical signal, the optical signal is transferred through an optical fiber, and a receive end then converts the optical signal into the electrical signal.

FIG. 1 shows an optical module. The optical module includes a housing (not shown). An optical interface is disposed at an end of the housing. A circuit board 01, a blocking piece (not shown), and an optical fiber ribbon 02 are disposed inside the housing. The blocking piece is disposed between the circuit board 01 and the optical interface for blocking. An optical transceiver device 03 is disposed on the circuit board 01. One end of the optical fiber ribbon 02 is connected to the optical transceiver device 03. The other end passes through the blocking piece and is connected to the optical interface.

When the optical module is working, electromagnetic waves are generated at the optical transceiver device 03. These electromagnetic waves pass through a gap between the optical fiber ribbon 02 and the blocking piece, are radiated outward from the optical interface, and consequently interfere with other nearby electronic devices.

Referring to FIG. 7, FIG. 7 is a schematic structural diagram of an optical module. As shown in FIG. 7, the optical module mainly includes a housing 2.1, a circuit board 2.2, a lens component 2.3, and a chip 2.4 (the chip 2.4 is blocked by the lens component 2.3 and is therefore not shown in FIG. 7). The chip 2.4 is attached on the circuit board 2.2. The lens component 2.3 covers the chip 2.4. The circuit board 2.2 is fixedly disposed inside the housing 2.1. The chip 2.4 includes a laser diode (LD) driver, a limiting amplifier (LA), a trans-impedance amplifier (TIA), and the like. The chip 2.4 and the lens component 2.3 are used in combination to accomplish optical-to-electrical conversion.

During the working of the foregoing optical module, electronic elements in the optical module generate electromagnetic waves. For example, the high-frequency chip laser driver, the LA, and the TIA in the optical module generate high-frequency electromagnetic waves. The electromagnetic waves are radiated out from the optical module to cause electromagnetic interference (EMI) to other electronic instruments and devices. The EMI may affect normal working of the electronic instruments and devices, affect signal transmission and reception, and cause information errors, control failures, and the like. A switch is used as an example for specific description. During normal working of one switch, a 36-pcs optical module may be inserted. When an EMI index of the optical module is unqualified, two aspects will be affected: 1. Optical modules interfere with each other. When 36-pcs optical modules work at the same time, the performance of the optical modules is affected by the EMI between the optical modules. 2. Telecommunications devices such as switches are affected. The EMI of the 36-pcs optical module is superimposed, and as a result, an EMI index of a single switch exceeds a limit, and the performance of other electronic devices around the switch in a same equipment room is affected. To prevent the EMI of the optical module from damaging other devices or components, the EMI is usually reduced through the structural design of the optical module. For example, the circuit board 2.2 is disposed on the housing 2.1, so that the housing 2.1 and the circuit board 2.2 tightly fit to achieve a sealing effect of the housing. In this way, the electronic elements on the circuit board 2.2 are sealed inside the housing 2.1, to prevent the electromagnetic waves generated by the electronic elements from being diffracted out from the optical module to cause EMI to other devices outside the optical module.

However, for implementing sealing of the housing of the optical module, a relatively high requirement is imposed on the structural design of the housing 2.1 of the optical module. It is very difficult to meet a strict sealing requirement in production and manufacturing, and it is inconvenient to produce optical modules with sealed structures. The housing 2.1 and the circuit board 2.2 need to fit each other to implement the sealing of the housing of the optical module. However, it is very difficult to meet a strict sealing requirement of the housing of the optical module in production and manufacturing. In this case, the EMI index of the optical module cannot be effectively reduced by sealing the housing of the optical module, and the objective of further resolving EMI cannot be achieved.

As may be seen from above, how to reduce EMI is a problem that urgently needs to be resolved.

SUMMARY

Embodiments of the present disclosure provide an optical module, so as to resolve a problem that an existing optical module interferes with other nearby electronic devices because an electromagnetic wave generated at an optical transceiver device passes through a gap between an optical fiber ribbon and a blocking piece and is radiated outward from an optical interface.

In an optical module provided in an embodiment of the present disclosure, a first sealing piece is disposed inside a housing. The first sealing piece is located between a circuit board and an optical interface, and is sleeved over an optical fiber ribbon. The first sealing piece is configured to block a gap between the optical fiber ribbon and a blocking piece. Therefore, when the optical module is working, an electromagnetic wave generated at an optical transceiver device is radiated to the first sealing piece and is reflected by the first sealing piece. In this way, in one aspect, electromagnetic waves that pass through the gap between the optical fiber ribbon and the blocking piece are reduced. That is, electromagnetic waves that are radiated outward from the optical interface are reduced. In another aspect, the energy of electromagnetic waves is attenuated, so that interference caused to other nearby electronic devices is reduced.

In an optical module provided in the present application, a wave-absorbing pad is disposed on a circuit board. An opening is provided on the wave-absorbing pad. The wave-absorbing pad surrounds a lens component inside through the opening. The wave-absorbing pad is configured to absorb an incident electromagnetic wave. The wave-absorbing pad is disposed at the periphery of the lens component. An electromagnetic wave generated by a chip is radiated or refracted to the wave-absorbing pad. The wave-absorbing pad absorbs this electromagnetic wave and scatters and attenuates the electromagnetic wave. In the present application, one surface of the wave-absorbing pad fits a surface of the circuit board. The opposite other surface of the wave-absorbing pad fits an inner wall of a housing. In this way, the wave-absorbing pad isolates the lens component and the chip inside the opening. An electromagnetic wave generated by the optical module is directly radiated or is reflected several times until the electromagnetic wave enters the wave-absorbing pad. The wave-absorbing pad absorbs to the greatest extent the electromagnetic wave generated by the chip, and can reduce to the greatest extent EMI generated by the optical module.

An optical communication terminal provided in the present application includes the foregoing optical module. A wave-absorbing pad is disposed at the periphery of a lens component in the optical module. The optical module generates relatively low EMI. The optical communication terminal may be a device such as a switch and a router. Several optical modules are inserted in the optical communication terminal. When each optical module generates relatively low EMI, the EMI generated by the optical modules in the optical communication terminal is very low. During use, the optical communication terminal causes relatively low EMI to other devices around, and is more suitable for the application of optical communication terminals.

In one embodiment, an optical module includes a housing. An optical interface is disposed at an end of the housing. A circuit board, a blocking piece, and an optical fiber ribbon are disposed inside the housing. The blocking piece is disposed between the circuit board and the optical interface for blocking. An optical transceiver device is disposed on the circuit board. One end of the optical fiber ribbon is connected to the optical transceiver device. The other end of the optical fiber ribbon passes through the blocking piece and is connected to the optical interface. A first sealing piece is disposed inside the housing. The first sealing piece is located between the circuit board and the optical interface, and is sleeved over the optical fiber ribbon. The first sealing piece is configured to block a gap between the optical fiber ribbon and the blocking piece.

In some embodiments, an optical module may include a housing, a circuit board, a lens component, and a chip. The lens component covers the chip, and the chip is attached on the circuit board. A wave-absorbing pad is further disposed on the circuit board, an opening is provided on the wave-absorbing pad, and the wave-absorbing pad is disposed at a periphery of the lens component through the opening. One surface of the wave-absorbing pad fits a surface of the circuit board, and the opposite other surface of the wave-absorbing pad fits an inner wall of the housing.

In some embodiments, an optical module may include a first housing. The first housing includes a first bottom surface and first side walls disposed on two sides of the first bottom surface. The optical module may further include a second housing. The second housing includes a second bottom surface and second side walls disposed on two sides of the second bottom surface. The first side walls are inserted inside the second side walls to form contact with the second bottom surface, so as to form a hollow cavity. The optical module may include an electrically conductive adhesive tape. The electrically conductive adhesive tape is disposed inside the hollow cavity and placed at the contact between the first side walls and the second bottom surface. The optical module may include an optical interface portion. The optical interface portion is disposed at one end of the hollow cavity. The optical module may further include an electrical interface portion. The electrical interface portion is disposed at the other end, far away from the optical interface portion, of the hollow cavity. The optical module may include an optical module core portion. The optical module core portion is disposed inside the hollow cavity, being in optical-signal connection with the optical interface portion, and being in electrical-signal connection with the electrical interface portion.

Compared with the prior art, the foregoing technical solution improves the sealing performance of the optical module, and improves an electromagnetic shielding effect, so that EMI can be effectively reduced, thereby resolving a relatively severe EMI problem in the prior art.

It should be understood that the foregoing general description and the following detailed description are merely exemplary and illustrative, but should not constitute any limitation to the present disclosure.

BRIEF DESCRIPTION OF THE DRAWINGS

To describe the technical solutions of the embodiments of the present disclosure or the existing technology more clearly, the following briefly introduces the accompanying drawings required for describing the embodiments or the existing technology. Apparently, the accompanying drawings in the following description show only some embodiments of the present disclosure, and a person of ordinary skill in the art may still derive other drawings from these accompanying drawings without creative efforts.

Figure 1:
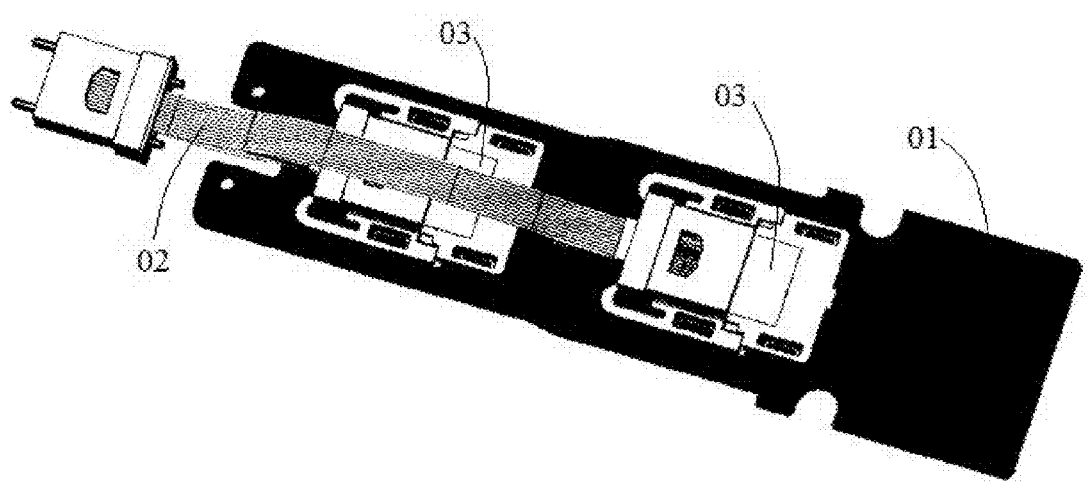
FIG. 1 is a schematic diagram of an optical module.

Symbol representation in FIG. 7 to FIG. 11 is:
2.1—housing,
2.2—circuit board,
2.3—lens component,
2.4—chip,
2.5—wave-absorbing pad, and
2.6—opening.
Symbol representation in FIG. 12 to FIG. 16 is as follows:
3.100, optical module;
3.11, first housing;
3.111, first side wall;
3.1111, first side wall section A;
3.1111a, first section A step;
3.1111b, second section A step;
3.1112, first side wall section B;
3.1112a, first section B step;
3.1112b, second section B step;
3.1113, deflection position;
3.112, step surface;
3.12, second housing;
3.121, second side walls;
3.1211, second side wall section A;
3.1212, second side wall section B,
3.122, clamping groove;
3.1221, U-shaped two sides;
3.1221a, clamping groove section A;
3.1221b, clamping groove section B;
3.1222, U-shaped bottom;
3.123, step surface;
3.13, hollow cavity;
3.14, electrically conductive adhesive tape;
3.141, U-shaped bottom;
3.142, U-shaped side arm;
3.1421, side arm section A;
3.1422, side arm section B;
3.15, accommodating portion;
3.2, optical interface portion;
3.3, electrical interface portion;
3.4, optical module core portion;
3.41, 3.41', PCB board;
3.42, 3.42', optical chip;
3.43, 3.43', optical lens module;
3.44, 3.44', electrical chip; and
3.45, 3.45', optical fiber ribbon.

The explicit embodiments of the present disclosure have been shown with reference to the foregoing drawings, and will further be described below in detail. These drawings and text description are not intended to limit the scope of the concept of the present disclosure in any manner. Instead, the concept of the present disclosure is described for a person skilled in the art with reference to specific embodiments.

DETAILED DESCRIPTION

The following clearly and completely describes the technical solutions in the embodiments of the present disclosure with reference to the accompanying drawings in the embodiments of the present disclosure. Apparently, the described embodiments are some of the embodiments of the present disclosure rather than all of the embodiments. All other embodiments obtained by a person of ordinary skill in the art based on the embodiments of the present disclosure without creative efforts shall fall within the protection scope of the present disclosure.

In the description of the present disclosure it needs to be understood that orientation or location relationships indicated by terms "center", "up", "down" "front" "rear" "left", "right", "vertical", "horizontal", "top", "bottom", "inside", and "outside" are based on orientation or location relationships shown in the accompanying drawings and are only used to facilitate description of the present disclosure and simplify description but are not used to indicate or imply that the apparatuses or elements must have specific orientations or are constructed and operated by using specific orientations and therefore cannot be understood as a limit to the present disclosure.

In the description of the present disclosure, it should be noted that unless otherwise expressly specified and defined terms such as "mounted", "connected", "connection" should be understood in a broad sense, for example, fixedly connected detachably connected or integrally connected; or connected directly or through an intermediate or two elements communicated internally. For a person of ordinary skill in the art, specific meanings of the terms in the present disclosure should be understood according to specific conditions.

FIG. 2 to FIG. 6 show a specific embodiment of an optical module according to an embodiment of the present disclosure. The optical module in this embodiment includes a housing 1. An optical interface A is disposed at an end of the housing 1. A circuit board 2, a blocking piece D, and an optical fiber ribbon 3 are disposed inside the housing 1. The circuit board 2 is a carrier for an optical transceiver device 4 and signals. The blocking piece D is disposed between the circuit board 2 and the optical interface A for blocking. The optical transceiver device 4 is disposed on the circuit board 2. The optical transceiver device 4 includes a transmit portion, a receive portion, and a lens. The transmit portion specifically includes a vertical cavity surface emitting laser (VCSEL) and a laser driver connected to the laser. Light emitted by the VCSEL travels upward along a direction perpendicular to the circuit board 2. The receive portion specifically includes a receiver diode, a TIA, an LA, and the like. The lens covers the transmit portion and the receive portion, and is configured to refract and reflect the light emitted by the VCSEL, to change the direction of the light. One end of the optical fiber ribbon 3 is connected to the optical transceiver device 4 through a first joint 7. The other end of the optical fiber ribbon 3 passes through the blocking piece D and is connected to the optical interface A through a second joint 8. The effect of the first joint 7 is to guide the light emitted by the VCSEL into the optical fiber ribbon 3. The effect of the second joint 8 is to guide light on an external optical fiber (not shown) into the optical fiber ribbon 3. Specifically, the first joint 7 and the second joint 8 are both a multi-fiber push-on (MPO) optical fiber connector, that is, a multi-core multi-channel pluggable-type connector. During transmission, the light emitted by the VCSEL is refracted by the lens to enter the first joint 7, then passes through the optical fiber ribbon 3 to reach the second joint 8, and is then transmitted into the external optical fiber through a joint on the external optical fiber. During reception, light on the external optical fiber passes through the second joint 8 to enter the optical module, then passes through the optical fiber ribbon 3 to reach the first joint 7, then reaches the lens, and is refracted by the lens and then transmitted to the receiver diode. A first sealing piece 5 is further disposed inside the housing. The first sealing piece 5 is located between the circuit board 2 and the optical interface A, and is sleeved over the optical fiber ribbon 3. The first sealing piece 5 is configured to block a gap between the optical fiber ribbon 3 and the blocking piece D.

In the optical module provided in this embodiment of the present disclosure, the first sealing piece 5 is disposed inside the housing 1. The first sealing piece 5 is located between the circuit board 2 and the optical interface A, and is sleeved over the optical fiber ribbon 3. The first sealing piece 5 is configured to block the gap between the optical fiber ribbon 3 and the blocking piece D. Therefore, when the optical module is working, an electromagnetic wave generated at the optical transceiver device 4 is radiated to the first sealing piece 5, and is reflected by the first sealing piece 5. In this way, in one aspect, electromagnetic waves that pass through the gap between the optical fiber ribbon 3 and the blocking piece D are reduced. That is, electromagnetic waves that are radiated outward from the optical interface A are reduced. In another aspect, the energy of the electromagnetic waves is attenuated, so that interference caused to other nearby electronic devices is reduced.

In the foregoing embodiment, some slits exist between the first sealing piece 5 and the optical fiber ribbon 3. Therefore, an electromagnetic wave is radiated outward through these slits and causes interference to other nearby electronic devices. To mitigate the foregoing problem, in this embodiment, a second sealing piece 6 is disposed in a matching manner between an upper surface B of the optical fiber ribbon 3 and the housing 1, and a second sealing piece 6 is disposed in a matching manner between a lower surface C of the optical fiber ribbon 3 and the housing 1. That is, the second sealing pieces 6 and the first sealing piece 5 are arranged along the length direction of the optical fiber ribbon 3. The second sealing pieces 6 are configured to block slits between the optical fiber ribbon 3 and the first sealing piece 5. That is, the second sealing pieces 6 may block slits at corresponding positions between the upper surface B and the first sealing piece 5 and between the lower surface C and the first sealing piece 5, thereby reducing outward radiation of electromagnetic waves, so that a problem of causing interference to other nearby electronic devices is further mitigated.

Figure 3:
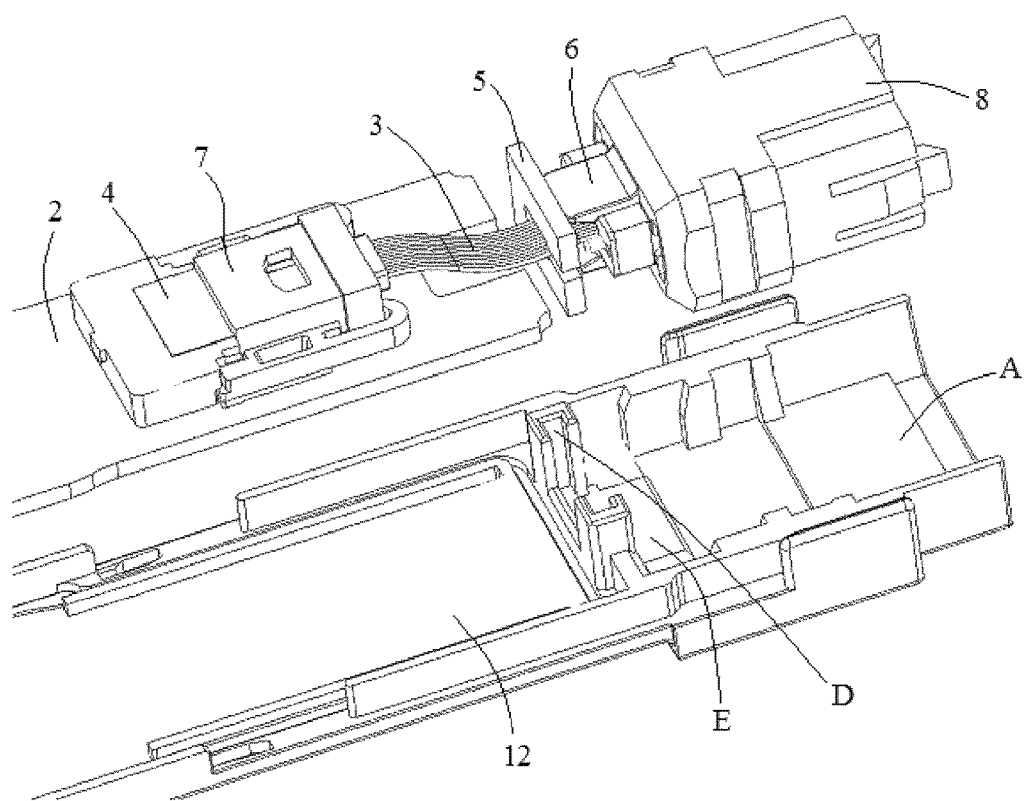
FIG. 3 is an exploded view of FIG. 2.

Referring to FIG. 3, the blocking piece D is a clamping groove. The first sealing piece 5 is clamped inside the clamping groove. In this way, the first sealing piece 5 may be fixed through the clamping groove, so that the structure of the optical module becomes more stable and the effect of reflecting electromagnetic waves is improved.

Referring to FIG. 3, a boss E is respectively disposed on an inner surface of the housing 1 at positions corresponding to two second sealing pieces 6. The bosses E are held against the corresponding second sealing pieces 6. In this way, the set thicknesses of the second sealing pieces 6 can be reduced.

Figure 6:
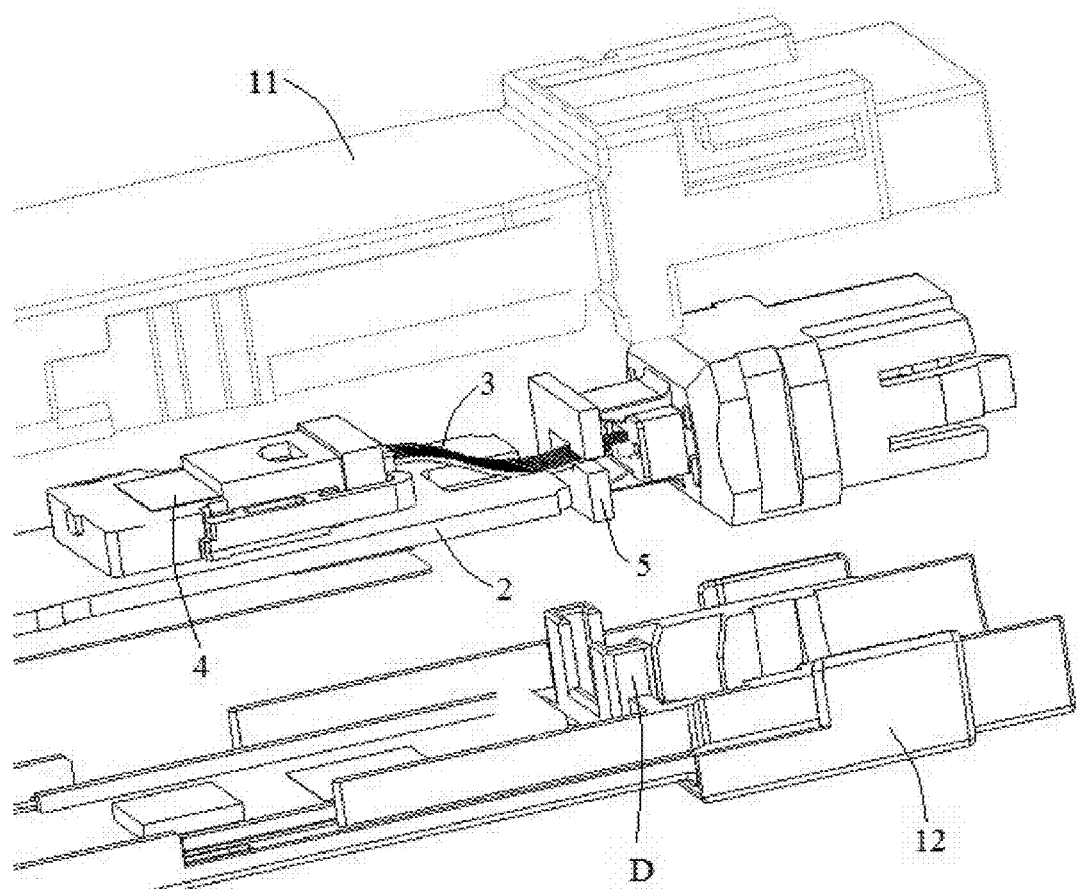
FIG. 6 is a schematic diagram of an upper housing and a lower housing in the optical module according to the embodiment of the present disclosure.

Referring to FIG. 6, the housing 1 includes an upper housing 11 and a lower housing 12. The clamping groove is respectively disposed on both an inner surface of the upper housing 11 and an inner surface of the lower housing 12. In this way, the first sealing piece 5 may be fixed through two clamping grooves, thereby improving the effect of fixing the first sealing piece 5, so that the structure of the optical module becomes more stable and the effect of reflecting electromagnetic waves is improved.

Preferably, the second sealing pieces 6 are made of a flexible material. Each of the second sealing pieces 6 is attached on or makes contact to the optical fiber ribbon 3 under the effect of a pressure from corresponding positions on the housing 1. Along the width direction of the optical fiber ribbon 3, the size of each of second sealing pieces 6 is greater than the size of the optical fiber ribbon 3. Because the optical fiber ribbon 3 is relatively thin, the portions of the two second sealing pieces 6 not exceeding the width of the optical fiber ribbon 3 may block or fill the slits at corresponding positions between the upper surface B and the first sealing piece 5 and between the lower surface C and the first sealing piece 5. The portions that exceed the width of the optical fiber ribbon 3 may block slits at corresponding positions between two side surfaces F and the first sealing piece 5. That is, the two second sealing pieces 6 may tightly block or fill a ring of slits around the optical fiber ribbon 3, so as to completely cut off a channel or any gap through which an electromagnetic wave is radiated outward, so as to further completely avoid a problem of causing interference to other nearby electronic devices.

Figure 4:
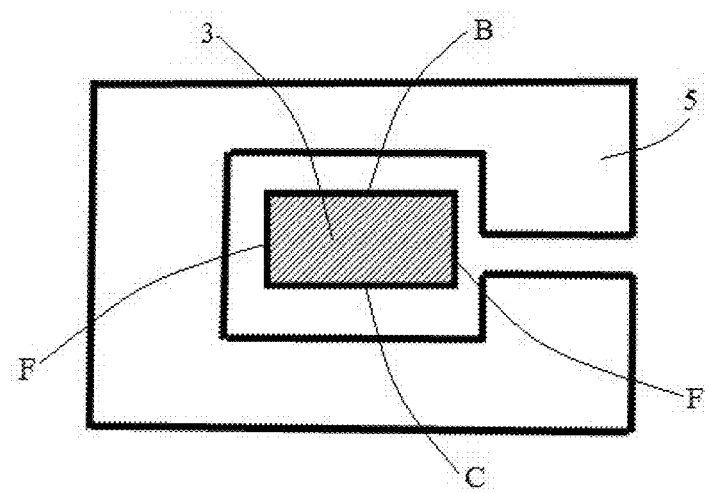
FIG. 4 is a schematic diagram of a first sealing piece in the optical module according to the embodiment of the present disclosure.
Figure 5:
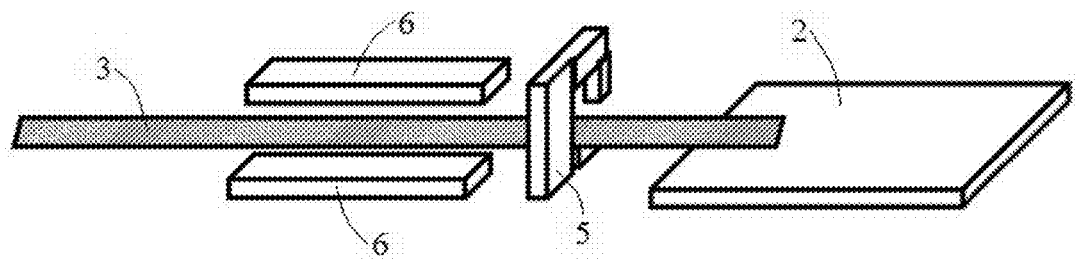
FIG. 5 is a schematic diagram of relative positions of the first sealing piece and second sealing pieces in the optical module according to the embodiment of the present disclosure.

The first sealing piece 5 may have a ring shape or a C shape. In this embodiment, the first sealing piece 5 preferably has a C shape, as shown in FIG. 4. In this way, the optical fiber ribbon 3 may be mounted in the C-shaped first sealing piece 5 from a notch of the C-shaped first sealing piece 5, thereby facilitating mounting.

Figure 2:
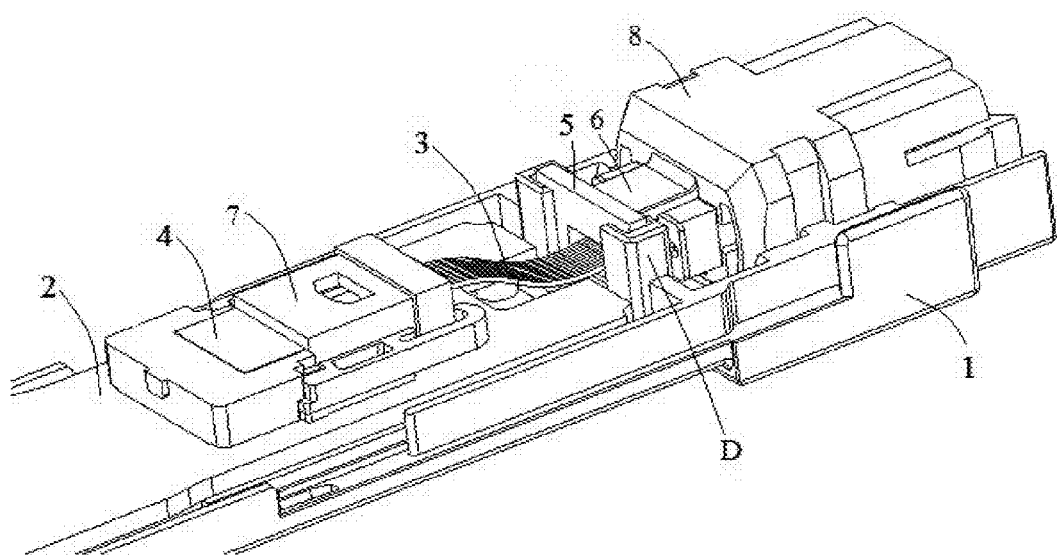
FIG. 2 is a schematic diagram of an optical module according to an embodiment of the present disclosure.

Referring to FIG. 2 and FIG. 3, the first sealing piece 5 is disposed close to the optical interface A. In this way, the internal structure of the optical module may be more compact, thereby further facilitating formation.

Various materials, for example, a metal material, and a wave-absorbing material, may be selected for the first sealing piece 5. In this embodiment, the first sealing piece 5 is preferably made of a wave-absorbing material. In this way, the first sealing piece 5 not only can reflect an electromagnetic wave, but also can absorb the electromagnetic wave, so that interference caused to other nearby electronic devices is further reduced.

Figure 9:
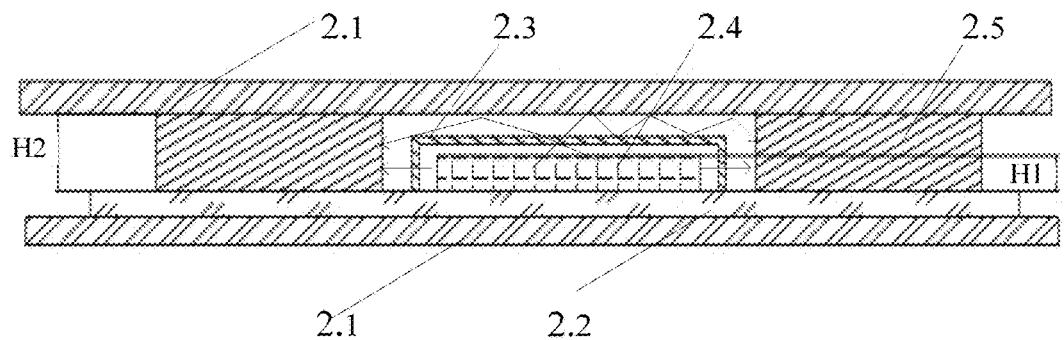
FIG. 9 is a sectional view of a part 1 of the optical module provided in the embodiment of the present application.

Referring to FIG. 9, when the optical module is working and is used, a chip 2.4 generates an electromagnetic wave.

The electromagnetic wave is radiated out from the optical module and causes EMI to other elements or devices. When the EMI reaches particular intensity, normal working of other elements or devices is affected.

In an solution, when the housing 2.1 and the circuit board 2.2 of the optical module are used in combination, the circuit board 2.2 and the housing 2.1 form a sealed cavity. Elements such as the chip 2.4 on the circuit board 2.2 are sealed inside the sealed cavity. An electromagnetic wave generated by the chip 2.4 is isolated inside the sealed cavity. The electromagnetic wave is not radiated out from the optical module to cause EMI to other elements or devices outside the optical module. For example, a step matching the circuit board 2.2 is disposed on the housing 2.1, so that the housing 2.1 and the circuit board 2.2 tightly fit to achieve a sealing effect of the housing. However, for implementing sealing of the housing of the optical module, a relatively high requirement is imposed on the structural design of the housing 2.1 of the optical module. It is very difficult to meet a strict sealing requirement in production and manufacturing, and it is inconvenient to produce optical modules with sealed structures. It is very difficult to meet a strict sealing requirement in production and manufacturing of the optical module. In this case, the EMI index of the optical module cannot be effectively reduced by sealing the housing of the optical module, and the objective of further resolving EMI cannot be achieved. In addition, to prevent the chip 2.4 in the optical module from generating the electromagnetic wave to cause EMI to other devices, an EMI elastic sheet may be disposed on another device or the devices may be grounded. However, anti-EMI performance formed by the EMI elastic sheet or through grounding is unstable, and cannot safely resolve an EMI problem caused by the optical module for the devices.

To resolve the EMI problem caused by the chip 2.4 in the optical module, it may be considered to spray a wave-absorbing material on the housing 2.1 and the circuit board 2.2 of the optical module. However, the wave-absorbing material has an effect of absorbing and attenuating only an incident electromagnetic wave. The electromagnetic wave generated by the chip 2.4 in the optical module does not have a sole propagation direction. In this case, the sprayed wave-absorbing material cannot desirably absorb the electromagnetic wave generated by the chip 2.4, and cannot resolve the EMI problem caused by the chip 2.4.

To resolve the foregoing technical problems, embodiments of the present application provide an optical module and an optical communication terminal, so that EMI generated by the optical module can be reduced.

To make the technical solutions in this specification more comprehensible to a person skilled in the art, the following clearly and completely describes the technical solutions in the embodiments of the present disclosure with reference to the accompanying drawings in the embodiments of this specification. Apparently, the described embodiments are merely some of the embodiments of this specification rather than all of the embodiments. All other embodiments obtained by a person of ordinary skill in the art based on the embodiments of this specification without creative efforts shall fall within the protection scope of this specification.

The specific embodiments of the present disclosure are described in detail below with reference to the accompanying drawings.

Figure 8:
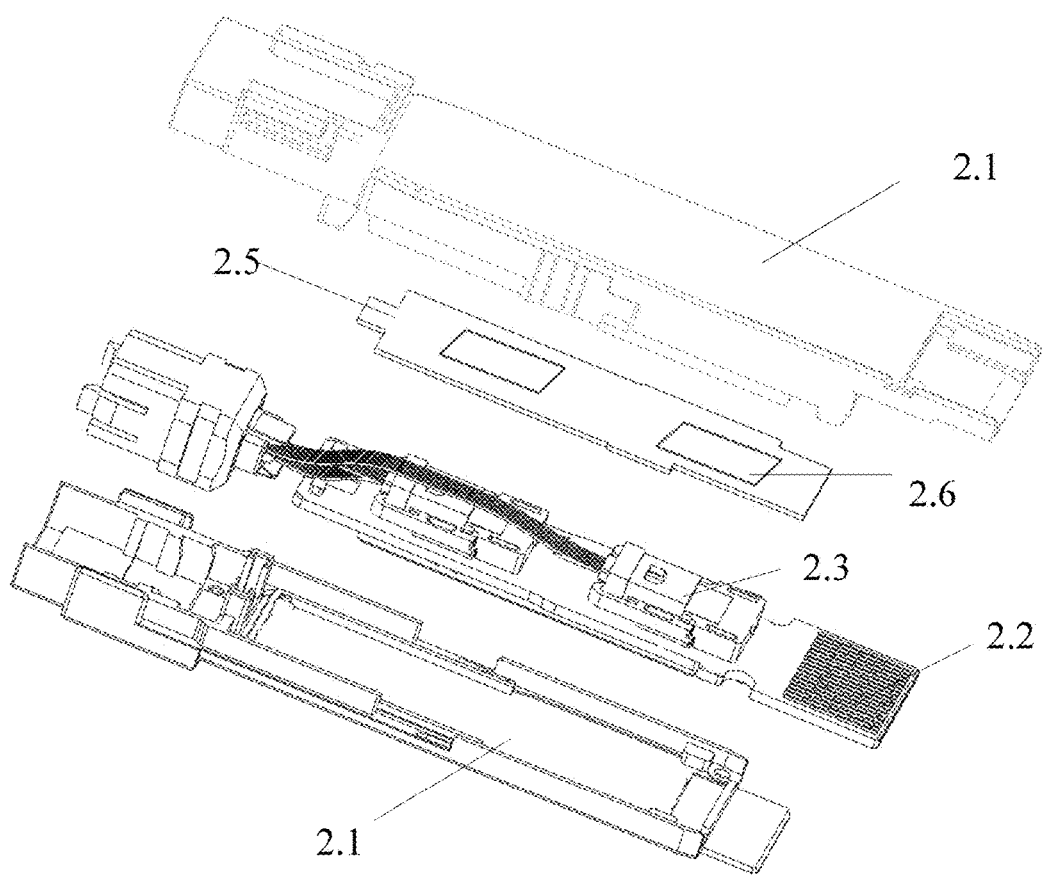
FIG. 8 is a schematic structural diagram of an optical module provided in an embodiment of the present application.

For one embodiment, referring to FIG. 8, FIG. 8 is a schematic structural diagram of an optical module provided in an embodiment of the present application. As shown in FIG. 8, the optical module mainly includes a housing 2.1, a circuit board 2.2, a lens component 2.3, and a chip 2.4. The lens component 2.3 covers the chip 2.4. The chip 2.4 is attached on the circuit board 2.2. A wave-absorbing pad 2.5 is further disposed on the circuit board 2.2. An opening 2.6 is provided on the wave-absorbing pad 2.5. The wave-absorbing pad 2.5 is disposed at the periphery of the lens component 2.3 through the opening 2.6. One surface of the wave-absorbing pad 2.5 fits a surface of the circuit board 2.2. The opposite other surface of the wave-absorbing pad 2.5 fits an inner wall of the housing 2.1.

Figure 7:
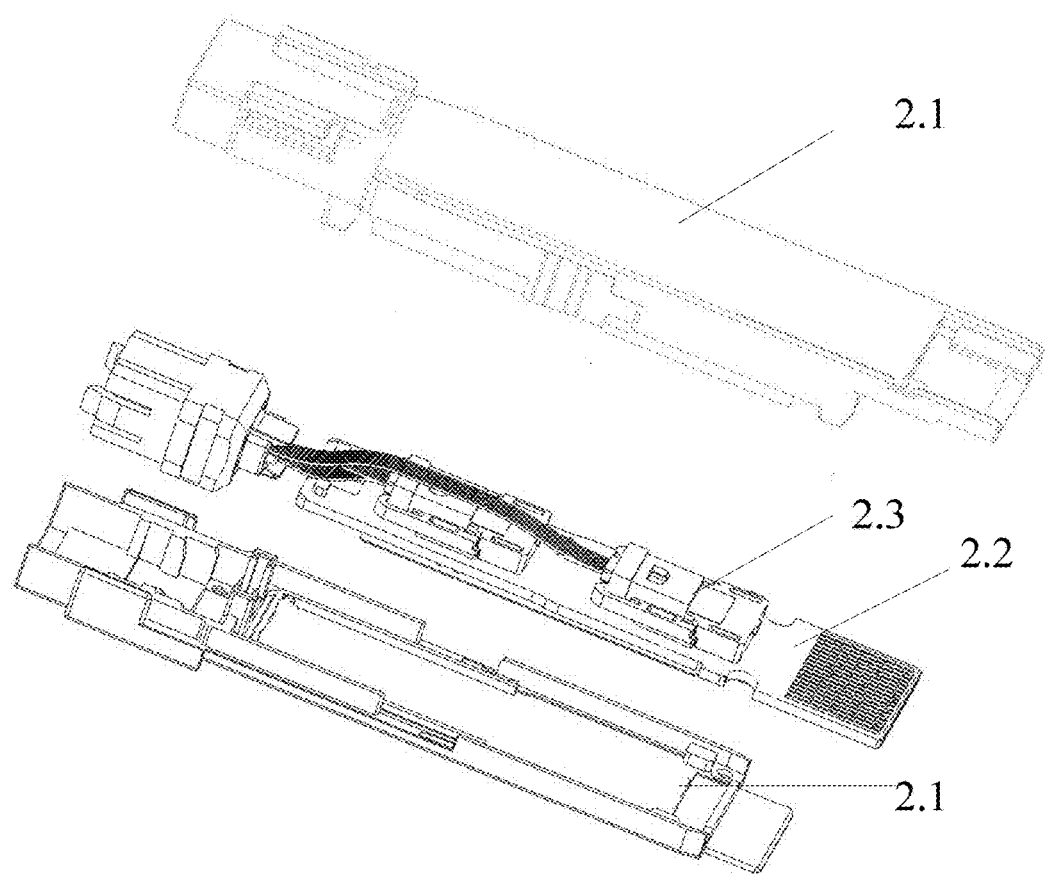
FIG. 7 is a schematic structural diagram of an optical module.

Generally, the housing 2.1 includes at least two portions. As shown in FIG. 7 and FIG. 8, the housing 2.1 includes an upper housing and a lower housing. When the lens component 2.3 and the chip 2.4 on the optical module are located on a surface, facing the upper housing, of the circuit board 2.2, the opposite other surface of the wave-absorbing pad 2.5 fits an inner wall of the upper housing. When the lens component 2.3 and the chip 2.4 on the optical module are located on a surface, facing the lower housing, of the circuit board 2.2, the opposite other surface of the wave-absorbing pad 2.5 fits an inner wall of the lower housing.

The wave-absorbing pad 2.5 is made of a type of wave-absorbing materials that can effectively absorb an incident electromagnetic wave and scatter and attenuate the incident electromagnetic wave. By using various loss mechanisms of materials, the wave-absorbing pad 2.5 converts the incident electromagnetic wave into thermal energy or into another form of energy to achieve the objective of absorbing an electromagnetic wave. In this embodiment of the present application, a frequency band range of EMI that the wave-absorbing pad 2.5 can absorb is from 0.72 GHz to 40 GHz. For example, main constituents of a ferrite wave-absorbing material include alloy powder, ferrite, electrically conductive fiber, and the like. Wave-absorbing materials for fixed frequency bands have different proportions of constituents.

The shape of the opening 2.6 on the wave-absorbing pad 2.5 may be regular or irregular, and may have an outer contour similar to that of the lens component 2.3. In this embodiment of the present application, the opening 2.6 is a through hole.

Figure 10:
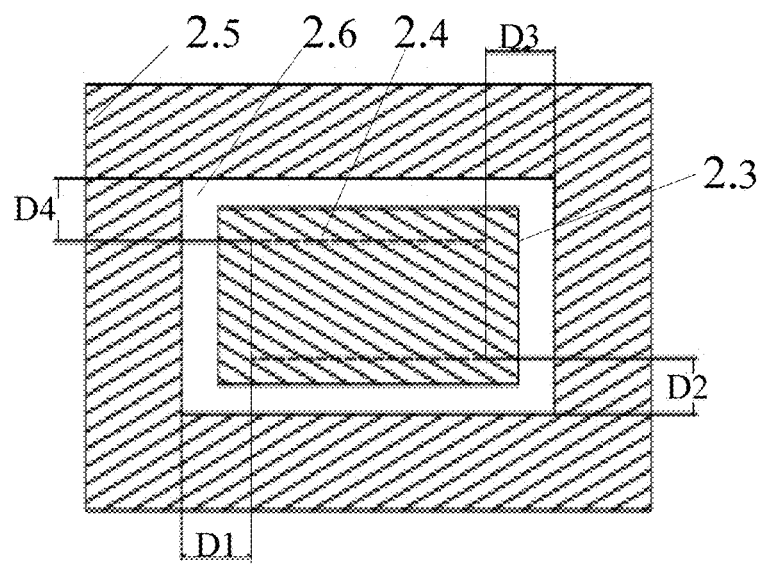
FIG. 10 is a sectional view of a part 2 of the optical module provided in the embodiment of the present application.

To fully utilize the performance of absorbing an electromagnetic wave of the wave-absorbing material, in this embodiment of the present application, the wave-absorbing pad 2.5 is used. The opening 2.6 is provided on the wave-absorbing pad 2.5. The opening 2.6 corresponds to the lens component 2.3 one by one in terms of quantity. The wave-absorbing pad 2.5 surrounds the lens component 2.3 and the chip 2.4 inside through the opening 2.6. In this way, the performance of absorbing an electromagnetic wave of the wave-absorbing material may be fully utilized. In this embodiment of the present application, for ease of expression, the electrical conversion component 2.4 is abstracted into a cubic structure. The electrical conversion component 2.4 may be a chip. As shown in FIG. 9 and FIG. 10, FIG. 9 is a sectional view of a part 1 of the optical module provided in this embodiment of the present application, and FIG. 10 is a sectional view of a part 2 of the optical module provided in this embodiment of the present application. FIG. 9 and FIG. 10 show the structural distribution state of the electrical conversion component 2.4 and the wave-absorbing pad 2.5 at the periphery of the electrical conversion component 2.4 in the optical module provided in this embodiment of the present application. The wave-absorbing pad 2.5 isolates the electrical conversion component 2.4 inside the opening 2.6 on the wave-absorbing pad 2.5.

In this embodiment of the present application, the electromagnetic wave generated by the chip 2.4 directly enters or is refracted several times to enter the wave-absorbing pad 2.5. The wave-absorbing pad 2.5 effectively absorbs an incident electromagnetic wave and scatters and attenuates the incident electromagnetic wave, thereby effectively reducing EMI generated by the chip 2.4 in the optical module. Arrows in FIG. 9 represent propagation directions of some electromagnetic waves generated by the chip 2.4.

The capability of attenuating an electromagnetic wave by a wave-absorbing material is generally represented by a tangent value of an electrical loss angle and a tangent value of a magnetic loss angle, which are respectively as follows:

$$\tan\delta_\varepsilon = \frac{\varepsilon''}{\varepsilon'}, \text{ and } \tan\delta_\mu = \frac{\mu''}{\mu'},$$

where $\delta$ is a loss angle, $\varepsilon$ is a dielectric constant, and $\mu$ is magnetic conductivity. When the wave-absorbing material has a larger tangent value of an electrical loss angle and a larger tangent value of a magnetic loss angle, the wave-absorbing capability is stronger.

When an electromagnetic wave enters an incident medium from air, according to refraction and reflection principles of waves, assuming that a dielectric constant of air and the magnetic conductivity of air are both 1, the following may be obtained:

$$\lambda_1 = \frac{\lambda_0}{\varepsilon_1 \mu_1},$$

where $\lambda_0$ is a propagation wavelength of an electromagnetic wave in air, $\lambda_1$ is a propagation wavelength of the electromagnetic wave in the incident medium, $\varepsilon_1$ is a dielectric constant of the incident medium, and $\lambda_1$ is the magnetic conductivity of the incident medium.

In this way, it may be obtained according to the foregoing relationship that the absorption by the wave-absorbing pad 2.5 of an electromagnetic wave generated by the chip 2.4 is closely related to an incident path of the electromagnetic wave.

A metal surface of the housing 2.1 of the optical module and a surface of the chip 2.4 have only an effect of reflecting an electromagnetic wave but do not have an effect of absorbing the electromagnetic wave. Only the wave-absorbing material has an effect of absorbing an electromagnetic wave. Instead of 100% absorption of electromagnetic waves, approximately 10% of the electromagnetic waves are still reflected. When this 10% of the electromagnetic waves are reflected internally and transferred again to the wave-absorbing material, another 90% of the 10% is absorbed. Eventually, the energy of electromagnetic radiation is extremely low. Because the opening 2.6 is a through hole, an inner wall of the housing 2.1 is provided in a projection direction, away from the circuit board 2.2, of the lens component 2.3. The electromagnetic wave generated by the chip 2.4 is conveyed to the inner wall of the housing 2.1, is directly reflected by the inner wall of the housing 2.1, is reflected several times, and eventually enters the wave-absorbing pad 2.5. During the propagation of the electromagnetic wave, an incident path along which the electromagnetic wave is propagated to the wave-absorbing pad 2.5 may be adjusted through the several times of reflection. The incident path along which the electromagnetic wave is propagated to the wave-absorbing pad 2.5 is related to the distance between an edge of the opening 2.6 on the wave-absorbing pad 2.5 and the chip 2.4 and the thickness of the wave-absorbing pad 2.5.

For ease of description, as shown in FIG. 9, it is set that the height of the chip 2.4 be H1, and the thickness of wave-absorbing pad 2.5 be H2. As shown in FIG. 10, let intervals between edges of the chip 2.4 and side walls of the opening 2.6 be respectively D1, D2, D3, and D4.

According to the foregoing relationship, requirements on D1, D2, H1, and H2 are obtained. It is mainly to provide an optimal emission path and incident path for electromagnetic radiation of the chip inside the module, so that the effect of absorbing an electromagnetic wave of the wave-absorbing material is optimized, and electromagnetic radiation that leaves the module is minimized.

To fully utilize the performance of absorbing an electromagnetic wave of the wave-absorbing pad 2.5, in a specific implementation of the present application, optionally, the intervals between the side walls of the opening 2.6 and the edges of the chip 2.4 are 0.5 to 2.5 times the height of the chip 2.4, that is, D1=(0.5 to 2.5)×H1, D2=(0.5 to 2.5)×H1, D3=(0.5 to 2.5)×H1, and D4=(0.5 to 2.5)×H1. The thickness of the wave-absorbing pad 2.5 is 1 to 6 times the height of the chip 2.4, that is, H2=(1 to 6)×H1. In this way, the electromagnetic wave generated by the chip 2.4 has optimized emission inside the optical module, and a relatively desirable path is ensured during propagation of the electromagnetic wave to the wave-absorbing pad 2.5.

The shape of the opening 2.6 is similar to an outer contour of the chip 2.4. Optionally, the intervals between the side walls of the opening 2.6 and the edges of the chip 2.4 are equal, that is, D1=D2=D3=D4.

In a specific implementation of the present application, when a transmission rate of the optical module is larger, the intervals between the edges of the chip 2.4 and the wave-absorbing pad 2.5 are smaller. However, it is not necessarily better when the intervals between the edges of the chip 2.4 and the wave-absorbing pad 2.5 are as small as possible. Description is provided below with reference to specific examples:

(1) For an optical module whose transmission rate is 25G and corresponding 2×25G-, 4×25G-, and 8×25G-optical modules, experiments and tests of EMI of the optical modules show that when D1=D2=D3=D4=H1 and H2≈2×H1, the electromagnetic waves generated by the optical modules causes minimum radiation intensity to the outside. When an error is ±5%, there is no change distinct of the effect. When the error is 5% to 10%, the effect may reach 90%. When the error is 10% to 20%, the effect may reach 75%. When the error is 20% to 30%, the effect may reach 60%. When the error is 30% to 50%, the effect may reach 50%.

(2) For an optical module whose transmission rate is 10G and corresponding 2×10G-, 4×10G-, and 8×10G-optical modules, experiments and tests of EMI of the optical modules show that when D1=D2=D3=D4=2×H1, H2=4×H1, the electromagnetic waves generated by the optical modules causes minimum radiation intensity to the outside. When an error is ±5%, there is no change distinct of the effect. When the error is 5% to 10%, the effect may reach 90%. When the error is 10% to 20%, the effect may reach 75%. When the error is 20% to 30%, the effect may reach 60%. When the error is 30% to 50%, the effect may reach 50%.

In this way, more suitable intervals between the wave-absorbing pad 2.5 and the edges of the chip 2.4 and a more suitable thickness of the wave-absorbing pad 2.5 are selected according to transmission rates of the optical modules, so that the effect of absorbing an electromagnetic wave of the wave-absorbing pad 2.5 can further be improved.

In a specific implementation of the present application, according to the sizes of the chip 2.4 and the lens component 2.3, the intervals between the wave-absorbing pad 2.5 and the edges of the chip 2.4 and the thickness of the wave-absorbing pad 2.5 are carefully selected. For example, to ensure the requirements of the intervals between the wave-absorbing pad 2.5 and the edges of the chip 2.4 and the thickness of the wave-absorbing pad 2.5, the wave-absorbing pad 2.5 fits the periphery of the lens component 2.3. That is, the size of the opening 2.6 is the same as the contour of the periphery of the lens component 2.3. To ensure the intervals between the wave-absorbing pad 2.5 and the edge of the chip 2.4, an interval between the wave-absorbing pad 2.5 and the lens component 2.3 may be selected according to an actual case of the lens component 2.3. Moreover, a lens component having a more suitable size may be selected.

The wave-absorbing pad 2.5 may form an interference fit with the circuit board 2.2 through the housing 2.1, and is fixed in the optical module through the housing 2.1 and the circuit board 2.2. In a specific implementation of the present application, thermally conductive silicone or a thermally conductive adhesive, preferably, thermally conductive silica gel, may be disposed on a bonding surface between the wave-absorbing pad 2.5 and the circuit board 2.2 or between the wave-absorbing pad 2.5 and the housing 2.1. During use, thermal conductivity performance of thermally conductive silica gel may be utilized. The solidification of thermally conductive silica gel may further be used to adhere and fix the wave-absorbing pad 2.5.

Figure 11:
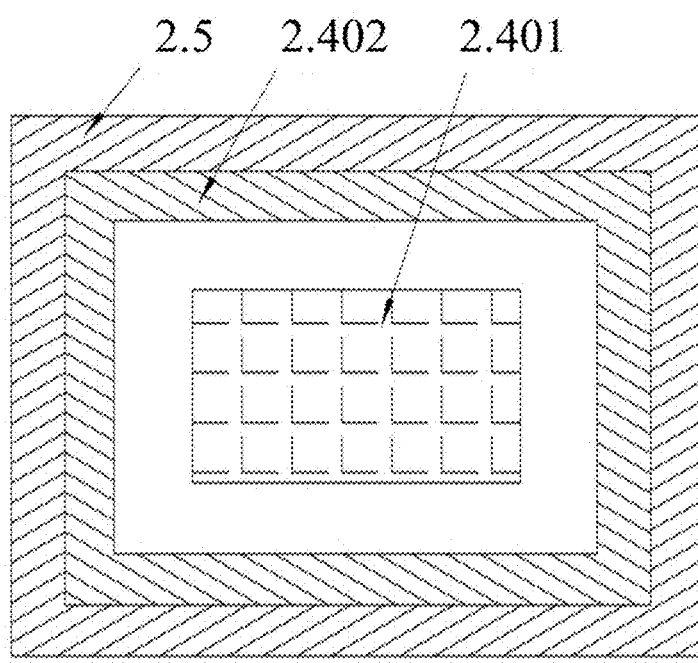
FIG. 11 is a schematic structural sectional view of a wave-absorbing pad provided in the embodiment of the present application.

In one embodiment as shown in FIG. 11, a thermally conductive layer 2.402 may be disposed on a wave-absorbing pad 2.5, and there is intervals between the edges of the chip 2.401 and the thermally conductive layer 2.402.

For the optical module provided in the present application, the wave-absorbing pad 2.5 is disposed on the circuit board. The opening 2.6 is provided on the wave-absorbing pad 2.5. The wave-absorbing pad 2.5 surrounds the lens component 2.3 inside through the opening 2.6. The wave-absorbing pad 2.5 is configured to absorb an incident electromagnetic wave. The wave-absorbing pad 2.5 is disposed at the periphery of the lens component 2.3. An electromagnetic wave generated by the chip 2.4 is radiated or refracted to the wave-absorbing pad 2.5. The wave-absorbing pad 2.5 absorbs this electromagnetic wave and scatters and attenuates the electromagnetic wave. In the present application, a surface of the wave-absorbing pad 2.5 fits a surface of the circuit board 2.2. The opposite other surface of the wave-absorbing pad 2.5 fits an inner wall of the housing 2.1. In this way, the wave-absorbing pad 2.5 isolates the lens component 2.3 and the chip 2.4 inside the opening 2.6. An electromagnetic wave generated by the optical module is directly radiated or is reflected several times until the electromagnetic wave enters the wave-absorbing pad 2.5. The wave-absorbing pad 2.5 absorbs to the greatest extent the electromagnetic wave generated by the chip 2.4, and can reduce to the greatest extent EMI generated by the optical module. The experiments and tests of EMI of optical module prove that when other conditions are not changed and only the wave-absorbing pad 2.5 is disposed in the foregoing manner, the intensity of an electromagnetic wave detected outside the optical module is less than 10% of the intensity of an electromagnetic wave generated by the optical module.

For another embodiment, based on the optical module provided in the foregoing embodiment, an embodiment of the present application further provides an optical communication terminal. The optical communication terminal includes an optical module provided in previous embodiment.

The optical communication terminal may be a device such as a switch and a router, so as to implement exchange and conversion of optical information. For the optical module provided in previous embodiment, the wave-absorbing pad 2.5 is disposed at the periphery of the lens component 2.3 in the optical module. The intensity of electromagnetic radiation in the optical module is relatively low. When several optical modules are inserted in the optical communication terminal and each optical module generates relatively low EMI, EMI generated by the optical modules in the optical communication terminal is also low. In this way, the optical communication terminal provided in this embodiment of the present application causes relatively low EMI to the outside.

The foregoing is merely detailed description of the present disclosure and enables a person skilled in the art to understand or implement the present disclosure. It is apparent to a person skilled in the art to make various changes to these embodiments. The general concept defined in the specification may be implemented in other embodiments without departing from the spirit and scope of the present disclosure. Therefore, the present disclosure is not limited to these embodiments shown in the specification, and instead is to meet the widest range consistent with the principles and novel features disclosed in the specification.

Figure 12:
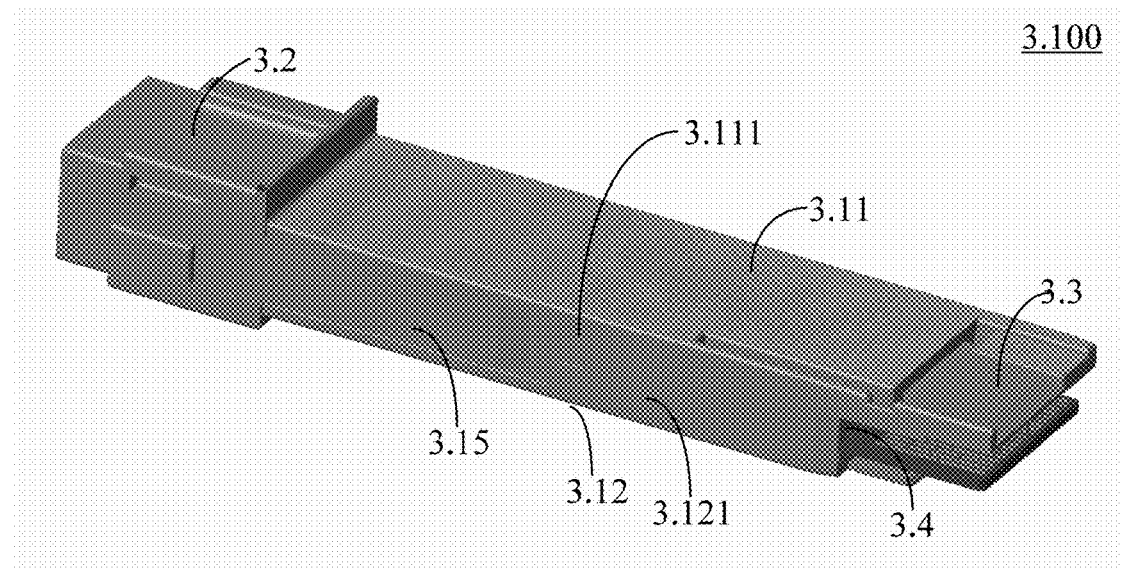
FIG. 12 is an assembled schematic structural view of an optical module shown in an exemplary embodiment of the present disclosure.
Figure 13:
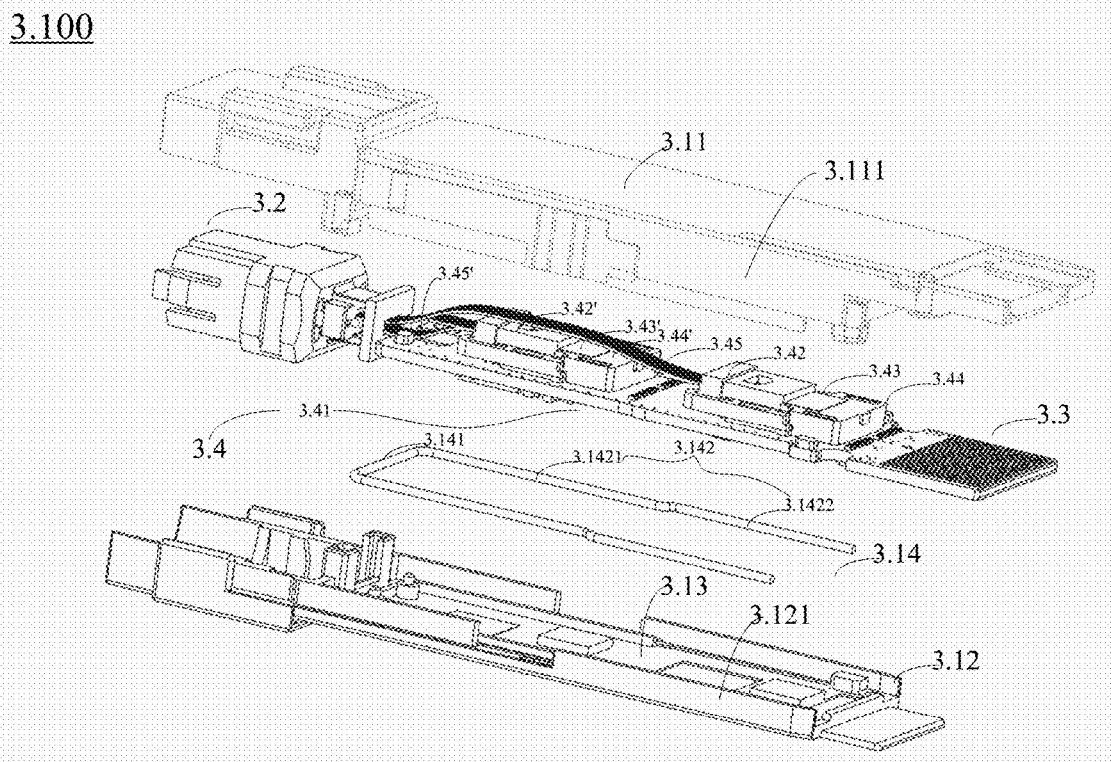
FIG. 13 is an exploded schematic structural view of an optical module shown in an exemplary embodiment of the present disclosure.

Referring to FIG. 12 and FIG. 13, FIG. 12 is an assembled schematic structural view of an optical module shown in an exemplary embodiment of the present disclosure, and FIG. 13 is an exploded schematic structural view of an optical module shown in an exemplary embodiment of the present disclosure.

As shown in FIG. 12, an optical module 3.100 includes: a first housing 3.11, a second housing 3.12, an optical interface portion 3.2, an electrical interface portion 3.3, and an optical module core portion 3.4.

The first housing 3.11 and the second housing 3.12 are nested to each other to form a hollow cavity 3.13.

Specifically, the first housing 3.11 includes a first bottom surface and first side walls 3.111 located on two sides of the first bottom surface. The second housing 3.12 includes a second bottom surface and second side walls 3.121 located on two sides of the second bottom surface.

When the first housing 3.11 and the second housing 3.12 are nested together, the first side walls 3.111 are inserted inside the second side walls 3.121 to form contact with the second bottom surface, so as to form the hollow cavity 3.13.

In this way, the first housing and the second housing are nested to each other to implement first-stage sealing of a casing of the optical module.

Further, the optical module 3.100 further includes an electrically conductive adhesive tape 3.14, and the electrically conductive adhesive tape 3.14 is used to form tight contact between the first housing 3.11 and the second housing 3.12.

Specifically, the electrically conductive adhesive tape 3.14 is located inside the hollow cavity 3.13, and is placed at the contact between the first side walls 3.111 and the second bottom surface. The electrically conductive adhesive tape 3.14 may be disposed on the first side walls 3.111, or may be disposed on the second bottom surface, which is not limited herein.

In this way, the electrically conductive adhesive tape is used to block slits between the first side walls and the second bottom surface, so as to implement second-stage sealing of the casing of the optical module. Compared with the first-stage sealing, the sealing performance of the optical module is further improved.

The optical interface portion 3.2 is located at one end of the hollow cavity 3.13.

The electrical interface portion 3.3 is located at the other end, far away from the optical interface portion 3.2, of the hollow cavity 3.13.

The optical module core portion 3.4 is located inside the hollow cavity 3.13, is in optical-signal connection with the optical interface portion 3.2, and is in electrical-signal connection with the electrical interface portion 3.3.

It should be noted that the "optical-signal connection" and "electrical-signal connection" mentioned above refer to a signal transmission direction of an optical signal or an electrical signal in the optical module core portion rather than a physical connection relationship. For example, an optical signal may be transmitted from the optical interface portion to the optical module core portion, and an electrical signal may be transmitted from the electrical interface portion to the optical module core portion.

In "two sides", "one end", and "the other end", the "side" is discussed in terms of the width direction of the optical module, and the "end" is discussed in terms of the length direction of the optical module.

In addition, in embodiments involved in the present disclosure, "inside" and "outside" are both discussed in terms of an inner side and an outer side of the hollow cavity. For example, an inward direction means a direction pointing to the inner side of the hollow cavity, and an outward direction means a direction pointing to the outer side of the hollow cavity.

Further, as shown in FIG. 13, the optical module core portion 3.4 includes a PCB board 3.41 and an optical chip 3.42, an optical lens module 3.43, and an electrical chip 3.44 that are carried on the PCB board 3.41. The optical chip 3.42 is connected to the optical interface portion 3.2 through an optical fiber ribbon 3.45. The electrical chip 3.44 is in electrical-signal connection with the electrical interface portion 3.3.

Furthermore, according to the quantity of channels, the optical module 3.100 may include a single-channel optical module, a dual-channel optical module, a multi-channel optical module, and the like. Therefore, for the optical module 3.100 having different quantities of channels, the quantities of the optical chips 3.42, the optical lens modules 3.43, and the electrical chips 3.44 that are carried on the PCB board 3.41 match the quantities of the channels. That is, the respective optical chip 3.42, optical lens module 3.43, and electrical chip 3.44 are carried on the PCB board 3.41 for each channel.

As shown in FIG. 13, the optical module 3.100 has two channels. In the dual-channel optical module, two sets of optical chips 3.42 and 3.42', optical lens modules 3.43 and 3.43', and electrical chips 3.44 and 3.44' are carried on the PCB board 3.41. The optical chips 3.42 and 3.42' are respectively connected to the optical interface portion 3.2 through optical fiber ribbons 3.45 and 3.45'.

Furthermore, the optical chip 3.42 includes, but is not limited to, a laser driver and a laser. The laser driver drives a laser according to an electrical signal to generate an optical signal.

The optical lens module 3.43 at least includes a lens. The lens is configured to couple optical signals. That is, when the lens is located at an optimal coupling position, the optical signal intensity of an optical signal has a maximum value.

The electrical chip 3.44 includes, but is not limited to, a microcontroller unit (MCU), a transmitter clock data recovery unit, a receiver clock data recovery unit, an LA, a photodiode, and a TIA.

The MCU implements functions such as logic signal monitoring of elements in the optical module, configuration of the laser driver, power management of the elements in the optical module, and control of communication with a main unit. The main unit may be a switch, a base station or the like that communicates with the optical module.

The transmitter clock data recovery unit and the receiver clock data recovery unit respectively perform transmission of transmitted data and received data represented by an electrical signal with the main unit, and effectively ensure the reliability of data transmission between the main unit and the optical module.

In the foregoing embodiment, on the premise of ensuring the square shape of the optical module, the first side walls of the first housing are inserted inside the second side walls of the second housing to form contact with the second bottom surface of the second housing, and the electrically conductive adhesive tape is further laid at the contact between the first side walls and the second bottom surface, to form tight contact between the first housing and the second housing. That is, the first housing and the second housing are nested to each other to implement first-stage sealing. The electrically conductive adhesive tape is used to block slits or small gaps between the first side walls and the second bottom surface to implement second-stage sealing, thereby improving the sealing performance of the optical module, and improving an electromagnetic shielding effect, so that EMI can be effectively reduced, thereby resolving a relatively severe EMI problem in the prior art.

It should be noted that in the structure of the optical module shown in FIG. 12, the first housing is located above the housing. It may be considered that the first housing is an upper housing. The second housing is located below the housing, and it may be considered that the second housing is a lower housing. In other embodiments, in the structure of the shown optical module, a position relationship between the first housing and the second housing is not limited thereto. Therefore, a specific position relationship between the first housing and the second housing is not limited in the embodiments involved in the present disclosure.

Figure 14:
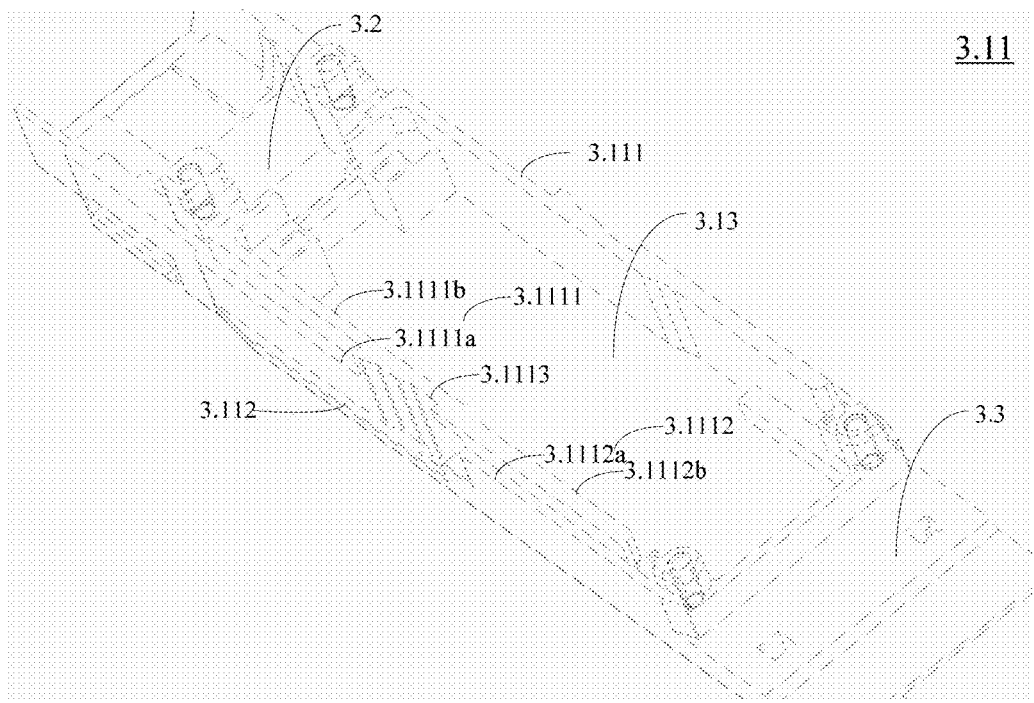
FIG. 14 is a schematic structural diagram of an embodiment of a first housing in the optical module shown in the embodiment in FIG. 12 or FIG. 13.

Referring to FIG. 14, FIG. 14 is a schematic structural diagram of an embodiment of the first housing in the optical module shown in the embodiment in FIG. 12 or FIG. 13.

As shown in FIG. 14, the first side walls 3.111 are provided on two sides of the first housing 3.11.

A first step and a second step are disposed on the first side walls 3.111. The second step is closer to the hollow cavity 3.13 than the first step is. A step surface of the second step protrudes from a step surface of the first step.

Moreover, each of the first side walls 3.111 includes a first side wall section A 3.1111 and a first side wall section B 3.1112 misaligned with each other along the width direction of the first housing 3.11. Preferably, the first side wall section A 3.1111 and the first side wall section B 3.1112 are integrally connected, and the first side wall section A 3.1111 deflects inward relative to the first side wall section B 3.1112. That is, for the two sides of the first housing 3.11, the distance between two first side wall sections A 3.1111 is less than the distance between two first side wall sections B 3.1112.

Specifically, two section A steps are disposed on the first side wall section A 3.1111. The two section A steps include a first section A step 3.1111a and a second section A step

3.1111*b*. The second section A step 3.1111*b* is closer to the hollow cavity 3.13 than the first section A step 3.1111*a* is, and a step surface of the second section A step 3.1111*b* protrudes from a step surface of the first section A step 3.1111*a*.

Two section B steps are disposed on the first side wall section B 3.1112. The two section B steps include a first section B step 3.1112*a* and a second section B step 3.1112*b*. The second section B step 3.1112*b* is closer to the hollow cavity 3.13 than the first section B step 3.1112*a* is, and a step surface of the second section B step 3.1112*b* protrudes from a step surface of the first section B step 3.1112*a*.

The foregoing step structure is disposed, so that not only the sealing performance of an optical module is further improved, an electromagnetic shielding effect is further improved, and EMI is further effectively reduced, but also mold opening of the optical module is facilitated, thereby reducing production costs of the optical module.

Further, the first side wall section A 3.1111 is close to the optical interface portion 3.2, and the first side wall section B 3.1112 is close to the electrical interface portion 3.3.

Further, the step surface of the first section A step 3.1111*a* on the first side wall section A 3.1111 and the step surface of the first section B step 3.1112*a* on the first side wall section B 3.1112 may be at the same height or not at the same height, which is not limited herein. Similarly, the step surface of the second section A step 3.1111*b* on the first side wall section A 3.1111 and the step surface of the second section B step 3.1112*b* on the first side wall section B 3.1112 may be at the same height or different heights, which is still not limited herein.

Furthermore, the optical module 3.100 further includes a step surface 3.112. The step surface 3.112 is disposed on an outer side of the first side walls 3.111, of the first housing 3.11, and close to the optical interface portion 3.2. That is, the step surface 3.112 extends outward from a top end of the first section A step 3.1111*a* on the first side wall section A 3.1111 to be level with the first section B step 3.1112*a* on the first side wall section B 3.1112. An unlocking elastic sheet may be placed on the step surface 3.112, and the unlocking elastic sheet is used to form a detachable connection between the optical module 3.100 and the main unit, thereby greatly facilitating combination and mounting of the optical module 3.100 and various types of main units.

In addition, an outer surface at a deflection position 3.1113 of each of the first side walls 3.111 has a sawtooth structure.

Moreover, the thicknesses of the first side walls 3.111 gradually increase along a direction from the optical interface portion 3.2 towards the electrical interface portion 3.3. That is, the thickness of the second section A step 3.1111*b* on the first side wall section A 3.1111 is less than the thickness at the deflection position 3.1113, and the thickness at the deflection position 3.1113 is less than the thickness of the second section B step 3.1112*b* on the first side wall section B 3.1112.

The structure in which the first side wall section A 3.1111 and the first side wall section B 3.1112 are misaligned with each other, the outer surface having a sawtooth structure at the deflection position 3.1113, and the gradually increasing thicknesses of the first side walls 3.111 that are discussed above all facilitate combination and mounting of the optical module 3.100 and various types of main units.

Figure 15:
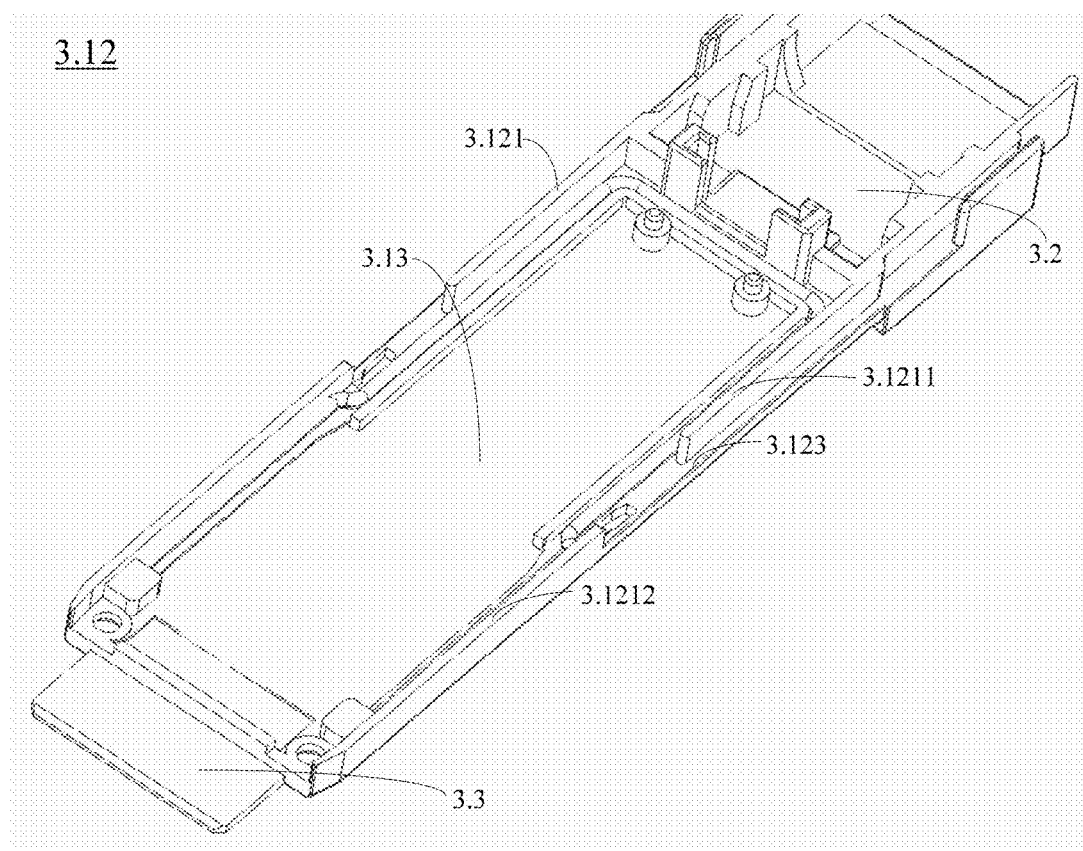
FIG. 15 is a schematic structural diagram of an embodiment of a second housing in the optical module shown in the embodiment in FIG. 12 or FIG. 13.

Referring to FIG. 15, FIG. 15 is a schematic structural diagram of an embodiment of the second housing in the optical module shown in the embodiment in FIG. 12 or FIG. 13.

As shown in FIG. 15, the second side walls 3.121 are provided on two sides of the second housing 3.12.

Each of the second side walls 3.121 includes a second side wall section A 3.1211 and a second side wall section B 3.1212 misaligned with each other along the width direction of the second housing 3.12. Preferably, the second side wall section A 3.1211 and the second side wall section B 3.1212 are separated from each other, and the second side wall section A 3.1211 is closer to the hollow cavity 3.13 than the second side wall section B 3.1212 is.

Further, the second side wall section A 3.1211 is close to the optical interface portion 3.2, and the second side wall section B 3.1212 is close to the electrical interface portion 3.3.

Further, the second side wall section A 3.1211 and the second side wall section B 3.1212 may be at the same height or not at the same height, which is not limited herein. Provided that, in other words, it is ensured that the second side wall section A 3.1211 can be joined to the first section A step 3.1111*a* on the first side wall section A 3.1111, and the second side wall section B 3.1212 can be joined to the first section B step 3.1112*a* on the first side wall section B 3.1112.

Furthermore, the optical module 3.100 further includes a step surface 3.123. The step surface 3.123 is disposed on an outer side of the second side walls 3.121, of the second housing 3.12, and close to the optical interface portion 3.2. That is, the step surface 3.123 extends outward from a bottom end of the second side wall section A 3.1211 to be level with the second side wall section B 3.1212. An unlocking elastic sheet may be placed on the step surface 3.123, and the unlocking elastic sheet is used to form a detachable connection between the optical module 3.100 and the main unit, thereby greatly facilitating combination and mounting of the optical module 3.100 and various main units.

Similarly, the above-mentioned structure in which the second side wall section A 3.1211 and the second side wall section B 3.1212 are misaligned with each other facilitates combination and mounting of the optical module 3.100 and various types of main units.

Figure 16:
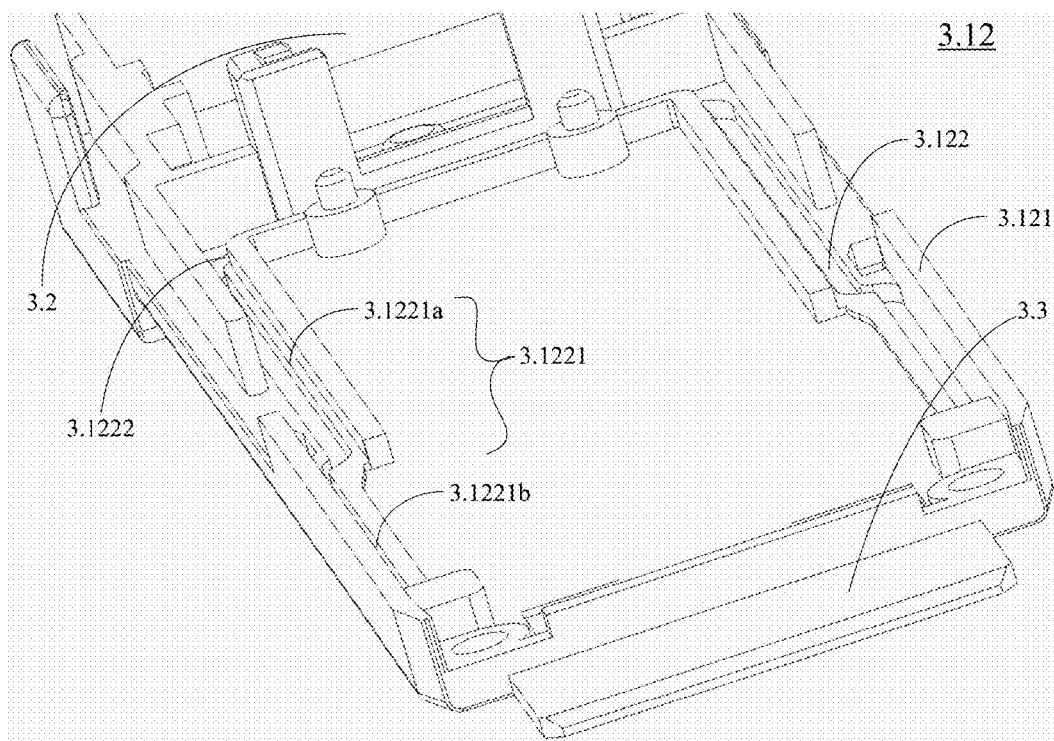
FIG. 16 is a schematic structural diagram of an embodiment of an electrically conductive adhesive tape in the optical module shown in the embodiment in FIG. 12 or FIG. 13.

Referring to FIG. 16, FIG. 16 is a schematic structural diagram of an embodiment of the electrically conductive adhesive tape in the optical module shown in the embodiment in FIG. 12 or FIG. 13.

As shown in FIG. 13, the optical module 3.100 further includes the electrically conductive adhesive tape 3.14. The electrically conductive adhesive tape 3.14 is used to form tight contact between the first housing 3.11 and the second housing 3.12.

A clamping groove 3.122 for placing the electrically conductive adhesive tape 3.14 is disposed on a second bottom surface of the second housing 3.12. The first side walls 3.111 of the first housing 3.11 are clamped into the clamping groove 3.122 to form contact with the electrically conductive adhesive tape 3.14. The shape of the clamping groove 3.122 matches the shapes of the first side walls 3.111 of the first housing 3.11. That is, the shape of the electrically conductive adhesive tape 3.14 matches the shapes of the first side walls 3.111 of the first housing 3.11.

That the shapes of the foregoing two match means that the clamping groove 3.122 include a clamping groove section A 3.1221*a* close to the optical interface portion 3.2 and a clamping groove section B 3.1221*b* close to the electrical interface portion 3.3. The clamping groove section A 3.1221*a* and the clamping groove section B 3.1221*b* are integrally connected, and the clamping groove section B 3.1221*b* deflects outward relative to the clamping groove section A 3.1221*a*. That is, the clamping groove section A 3.1221*a* and the clamping groove section B 3.1221*b* are misaligned with each other along the width direction of the second housing 3.12, and for the two sides of the second housing 3.12, the distance between the clamping groove sections B 3.1221*b* is greater than the distance between the clamping groove sections A 3.1221*a*.

Further, the clamping groove 3.122 approximately has a U shape. U-shaped two sides 3.1221 of the clamping groove 3.122 are close to the second side walls 3.121 of the two sides of the second housing 3.12. A U-shaped bottom 3.1222 of the clamping groove 3.122 is close to the optical interface portion 3.2. The U-shaped two sides 3.1221 of the clamping groove 3.122 include a clamping groove section 3.1221*a* and a clamping groove section 3.1221*b* that are integrally connected, and the clamping groove section 3.1221*b* deflects outward relative to the clamping groove section 3.1221*a*.

The electrically conductive adhesive tape 3.14 approximately has a U shape. The electrically conductive adhesive tape 3.14 having a U shape is placed in the clamping groove 3.122 having a U shape and forms contact with the first side walls 3.111. Similarly, the shape of the electrically conductive adhesive tape 3.14 also matches the shapes of the first side walls 3.111.

Specifically, a U-shaped bottom 3.141 of the electrically conductive adhesive tape 3.14 is close to the optical interface portion 3.2, and a U-shaped side arm 3.142 of the electrically conductive adhesive tape 3.14 includes a side arm section A 3.1421 and a side arm section B 3.1422 that are integrally connected.

With reference to FIG. 13, a side arm section A 3.1421 of the electrically conductive adhesive tape 3.14 is close to the optical interface portion 3.2, and a side arm section B 3.1422 of the electrically conductive adhesive tape 3.14 is close to the electrical interface portion 3.3. Moreover, the side arm section A 3.1421 deflects inward relative to the side arm section B 3.1422. In this way, the shapes of the first side walls 3.111 of the first housing 3.11, the shape of the electrically conductive adhesive tape 3.14, and the shape of the clamping groove 3.122 on the second housing 3.12 all match each other, so as to fully ensure tight contact between the first housing 3.11 and the second housing 3.12.

In combination with the foregoing embodiments, the sealing performance of the optical module is further improved, and an electromagnetic shielding effect is improved, thereby further reducing EMI.

With reference to FIG. 12 to FIG. 16, in a specific application scenario, a process in which the first housing and the second housing in the optical module are nested is described as follows.

When the first housing 3.11 and the second housing 3.12 are nested, the first housing 3.11 is inserted on an inner side of the second housing 3.12 instead of simply making the first housing 3.11 be joined to the second housing 3.12.

Specifically, because the first side walls 3.111 includes the first side wall section A 3.1111 close to the optical interface portion 3.2, and the first side wall section B 3.1112 close to the electrical interface portion 3.3. The second side walls 3.121 correspondingly include the second side wall section A 3.1211 close to the optical interface portion 3.2, and the second side wall section B 3.1212 close to the electrical interface portion 3.3. Moreover, the first section A step 3.1111*a* and the second section A step 3.1111*b* are disposed on the first side wall section A 3.1111, and the first section B step 3.1112*a* and the second section B step 3.1112*b* are disposed on the first side wall section B 3.1112.

Therefore, the second side wall section A 3.1211 is placed at the first section A step 3.1111*a* on the first side wall section A 3.1111, and is joined to the first section A step 3.1111*a* on the first side wall section A 3.1111, so that the second section A step 3.1111*b* on the first side wall section A 3.1111 is inserted inside the second side wall section A 3.1211 of the second housing 3.12 to form contact with the second bottom surface, close to the optical interface portion 3.2, of the second housing 3.12. The second side wall section B 3.1212 is placed at the first section B step 3.1112*a* on the first side wall section B 3.1112, and is joined to the first section B step 3.1112*a* on the first side wall section B 3.1112, so that the second section B step 3.1112*b* on the first side wall section B 3.1112 is inserted inside the second side wall section B 3.1212 of the second housing 3.12 to form contact with the second bottom surface, close to the electrical interface portion 3.3, of the second housing 3.12.

Moreover, when the first housing 3.11 and the second housing 3.12 are nested together, a step surface 3.123 on an outer side of the second side wall section A 3.1211 and a step surface 3.112 on an outer side of the first section A step 3.1111*a* on the first side wall section A 3.1111 fit each other. An inwardly concave accommodating portion 3.15 is formed on two sides, close to the optical interface portion 3.2, of the hollow cavity 3.13. The accommodating portion 3.15 is configured to accommodate an unlocking elastic sheet, thereby ensuring that the optical module can still keep a relatively regular rectangular structure after the unlocking elastic sheet is assembled, as shown in FIG. 12, so as to satisfy an industrial requirement on a square shape of the optical module.

In addition, the electrically conductive adhesive tape 3.14 is placed in advance in the clamping groove 3.122 disposed on the second bottom surface of the second housing 3.12, so that the first side walls 3.111 of the first housing 3.11 are clamped into the clamping groove 3.122 to form contact with the first side walls 3.111, so as to block the contact between the first side walls 3.111 and the second bottom surface of the second housing 3.12, that is, a slit between the second section A/B step 3.1111*b* or 3.1111*a* of the first housing 3.11 and the second bottom surface, to keep tight contact between the first housing 3.11 and the second housing 3.12.

In this way, it is implemented that the first housing and the second housing are nested to each other. That is, the first section A/B step of the first housing is joined to the second side wall section A/B of the second housing, and the second section A/B step of the first housing is inserted inside the second side walls of the second housing to form contact with the second bottom surface, thereby preliminarily satisfying the sealing performance requirement of the optical module. Moreover, the electrically conductive adhesive tape is laid at the contact between the first side walls and the second bottom surface of the second housing, so that slits between the first side walls and the second bottom surface are blocked by the electrically conductive adhesive tape. The sealing performance of the optical module is further improved, and an electromagnetic shielding effect is improved, so that EMI can be effectively reduced, thereby resolving a relatively severe EMI problem in the prior art.

Although the present disclosure has been described with reference to several typical implementations, it should be understood that the terms used are illustrative and exemplary but are not limitative. The present disclosure can be specifically implemented in many forms without departing from the spirit and essence of the present disclosure, and therefore it should be understood that the foregoing implementations are not limited to any details above but instead should be widely explained in the spirit and scope defined by the appended claims. Therefore, all changes and variations falling within the claims and equivalent scope thereof should all be covered by the appended claims.

What is claimed is:

1. An optical module, comprising:
   a housing;
   a circuit board within the housing;
   a lens component within the housing;
   a chip disposed on the circuit board, wherein the lens component is disposed on the chip; and
   a wave-absorbing pad disposed on the circuit board and comprising a through-hole opening, wherein the through-hole opening accommodates the lens component and the chip with the wave-absorbing pad surrounding a periphery of the lens component and the chip by side walls of the through-hole opening,
   wherein a first surface of the wave-absorbing pad fits a surface of the circuit board, and a second surface of the wave-absorbing pad fits an inner wall of the housing, wherein the first surface of the wave-absorbing pad is opposite to the second surface of the wave-absorbing pad; and
   wherein a non-zero separation between edges of the chip and the side walls of the through-hole opening of the wave-absorbing pad falls within a predetermined range of proportion to a height of the chip falling between 0.5 and 2.5.

2. The optical module according to claim 1, wherein the predetermined range of proportion is equal to one or two.

3. The optical module according to claim 1, wherein a thickness of the wave-absorbing pad is between one and six times the height of the chip.

4. The optical module according to claim 3, wherein the thickness of the wave-absorbing pad is equal to two times or four times the height of the chip.

5. The optical module according to claim 1, wherein a thermal conductive layer is disposed on a bonding surface between the wave-absorbing pad and the circuit board, and the thermal conductive layer comprises thermally conductive silica gel or thermally conductive silicone.

6. The optical module according to claim 1, further comprising an optical transmitter or optical receiver configured to operate at a data transmission or receiving rate at a base data frequency within a radio frequency range.

7. The optical module according to claim 6, wherein the base data frequency is between 10 GHz and 25 GHz.

8. The optical module according to claim 6, wherein the non-zero separation between the edges of the chip and the side walls of the through-hole opening is configured to depend on the base data frequency.

9. The optical module according to claim 8, wherein a ratio of a thickness of the wave-absorbing pad and the height of the chip is further configured to depend on the base data frequency.

10. The optical module according to claim 1, wherein the side walls of the through-hole opening of the wave-absorbing pad follow a contour of a periphery of the edges of the chip.

11. The optical module according to claim 10, wherein the non-zero separation between the side walls of the through-hole opening of the wave-absorbing pad and the edges of the chip is substantially same along the periphery of the edges of the chip.

12. The optical module according to claim 1, wherein the side walls of the through-hole opening of the wave-absorbing pad follow a contour of a periphery of edges of the lens component.

13. The optical module according to claim 1, further comprising another chip disposed on the circuit board and another lens component disposed on the another chip, wherein the wave-absorbing pad further comprises another through-hole opening configured to accommodate and surround the another chip and the another lens component.

14. A method for constructing an optical module, comprising:
   disposing a circuit board within a housing;
   disposing a lens component within the housing;
   placing a chip on the circuit board, wherein the lens component is disposed on the chip; and
   disposing a wave-absorbing pad on the circuit board, the wave-absorbing pad comprising a through-hole opening, wherein the through-hole opening accommodates the lens component and the chip with the wave-absorbing pad surrounding a periphery of the lens component and the chip by side walls of the through-hole opening,
   wherein a first surface of the wave-absorbing pad fits a surface of the circuit board, and a second surface of the wave-absorbing pad fits an inner wall of the housing, wherein the first surface of the wave-absorbing pad is opposite to the second surface of the wave-absorbing pad; and
   wherein a non-zero separation between edges of the chip and the side walls of the through-hole opening of the wave-absorbing pad falls within a predetermined range of proportion to a height of the chip falling between 0.5 and 2.5.

15. The method according to claim 14, wherein the predetermined range of proportion is equal to one or two.

16. The method according to claim 14, wherein a thickness of the wave-absorbing pad is between one and six times the height of the chip.

17. The method according to claim 16, wherein the thickness of the wave-absorbing pad is equal to two times or four times the height of the chip.

18. The method according to claim 14, wherein a thermal conductive layer is disposed on a bonding surface between the wave-absorbing pad and the circuit board, and the thermal conductive layer comprises thermally conductive silica gel or thermally conductive silicone.

* * * * *